US010923320B2

(12) United States Patent
Koh et al.

(10) Patent No.: US 10,923,320 B2
(45) Date of Patent: *Feb. 16, 2021

(54) SYSTEM FOR TUNABLE WORKPIECE BIASING IN A PLASMA REACTOR

(71) Applicant: APPLIED MATERIALS, INC., Santa Clara, CA (US)

(72) Inventors: Travis Koh, Sunnyvale, CA (US); Philip Allan Kraus, San Jose, CA (US); Leonid Dorf, San Jose, CA (US); Prabu Gopalraja, Santa Clara, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/521,094

(22) Filed: Jul. 24, 2019

(65) Prior Publication Data

US 2019/0348258 A1 Nov. 14, 2019

Related U.S. Application Data

(63) Continuation of application No. 15/424,405, filed on Feb. 3, 2017, now Pat. No. 10,373,804.

(51) Int. Cl.
*H01J 37/32* (2006.01)
*H01L 21/67* (2006.01)
*H01L 21/683* (2006.01)

(52) U.S. Cl.
CPC .. *H01J 37/32045* (2013.01); *H01J 37/32027* (2013.01); *H01J 37/32697* (2013.01);
(Continued)

(58) Field of Classification Search
CPC .......... H01J 37/32045; H01J 37/32027; H01J 37/32697; H01J 37/32715; H01J 21/67069; H01J 21/6833
See application file for complete search history.

(56) References Cited

U.S. PATENT DOCUMENTS 8,232,193 B2 7/2012 Chang
8,821,744 B2 9/2014 Ui et al.
(Continued)

OTHER PUBLICATIONS

International Search Report and Written opinion dated Jun. 27, 2018 for PCT Application No. PCT/US2018/015688.

*Primary Examiner* — Duy Vu N Deo
(74) *Attorney, Agent, or Firm* — Moser Taboada

(57) ABSTRACT

Systems and methods for tunable workpiece biasing in a plasma reactor are provided herein. In some embodiments, a system includes: a plasma chamber that performs plasma processing on a workpiece, a first pulsed voltage source, coupled directly to a workpiece, a second pulsed voltage source, coupled capacitively to the workpiece, and a biasing controller comprising one or more processors, and memory, wherein the memory comprises a set of computer instructions that when executed by the one or more processors, independently controls the first pulsed voltage source and the second pulsed voltage source based on one or more parameters of the first pulsed voltage source and the second pulsed voltage source in order to tailor ion energy distribution of the flux of ions directed to the workpiece.

20 Claims, 6 Drawing Sheets

(52) U.S. Cl.
CPC .. *H01J 37/32715* (2013.01); *H01L 21/67069* (2013.01); *H01L 21/6833* (2013.01); *H01J 2237/332* (2013.01); *H01J 2237/334* (2013.01)

(56) References Cited

U.S. PATENT DOCUMENTS

| | | | |
|---|---|---|---|
| 9,536,749 | B2 | 1/2017 | Marakhtanov et al. |
| 10,373,804 | B2 * | 8/2019 | Koh ................. H01J 37/32697 |
| 2007/0247074 | A1 | 10/2007 | Paterson et al. |
| 2009/0194508 | A1 | 8/2009 | Ui et al. |
| 2010/0248488 | A1 | 9/2010 | Agarwal et al. |
| 2013/0213935 | A1 | 8/2013 | Liao et al. |
| 2015/0002018 | A1 | 1/2015 | Lill et al. |
| 2016/0056017 | A1 | 2/2016 | Kim et al. |
| 2017/0140899 | A1 * | 5/2017 | Nakamura ........ H01L 21/31138 |
| 2017/0250056 | A1 | 8/2017 | Boswell et al. |

\* cited by examiner

SYSTEM FOR TUNABLE WORKPIECE BIASING IN A PLASMA REACTOR

CROSS-REFERENCE TO RELATED APPLICATIONS

This application is a continuation of co-pending U.S. patent application Ser. No. 15/424,405, filed Feb. 3, 2017 which is herein incorporated by reference.

FIELD

Embodiments of the present disclosure generally relate to a system for tunable workpiece biasing in a plasma reactor.

BACKGROUND

Ion bombardment is often used as a source of activation energy for chemical and physical processes in etch and chemical vapor deposition (CVD) processes for processing a semiconductor workpiece, for example, a wafer. Currently, wafer biasing technology uses radio frequency (RF) biasing techniques. These RF techniques generally use single frequency RF biasing to accelerate ions to be implanted into a wafer, which results in a fairly well known distribution of ion energy across the wafer. However, the density of ions at a particular ion energy (eV) is always distributed in well-known quantities, and the distribution is not tunable using RF biasing. Optimization of the etching process by careful control of the population of ions at a given ion energy is currently not possible, and the effect of different ion energies on process results is not known in detail.

Therefore, the inventors have provided a system that enables processing chambers to be tunable in order to tailor ion energy to independently control the maximum ion energy and the distribution of low and medium ion energies, or in other words, a system for tunable workpiece biasing in a plasma reactor.

SUMMARY

Systems and methods for tunable workpiece biasing in a plasma reactor are provided herein. In one embodiment, a system includes a plasma chamber that performs plasma processing on a workpiece, a first pulsed voltage source, coupled directly to a workpiece, a second pulsed voltage source, coupled capacitively to the workpiece, and a biasing controller comprising one or more processors, and memory, wherein the memory comprises a set of computer instructions that when executed by the one or more processors, independently controls the first pulsed voltage source and the second pulsed voltage source based on one or more parameters of the first pulsed voltage source and the second pulsed voltage source in order to tailor ion energy distribution of the flux of ions directed to the workpiece.

Another embodiment provides a method for tunable workpiece biasing in a plasma chamber. The method includes generating a high voltage by a first pulsed voltage source and coupling the high voltage to a workpiece in a plasma chamber, generating one or more of low and medium voltages by a second pulsed voltage source, coupling, capacitively, the one or more of low and medium voltages to the workpiece and pulsing the high voltage and the one or more of low and medium voltages by a biasing controller according to one or more parameters of the first pulsed voltage source and the second pulsed voltage source to tailor ion distribution in the workpiece.

In yet another embodiment, a system for tunable workpiece biasing includes a plasma chamber that performs plasma processing on a workpiece, a plurality of first pulsed voltage sources, each of the plurality of first pulsed voltage sources individually coupled to one or more pins electrically isolated from a base of the plasma chamber, the one or more pins being directly coupled to the workpiece in the plasma chamber, a second pulsed voltage source, coupled capacitively to the workpiece and a biasing controller that independently controls the first pulsed voltage source and the second pulsed voltage source based on one or more parameters of the first pulsed voltage source and the second pulsed voltage source in order to tailor ion energy distribution of the flux of ions directed to the workpiece.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
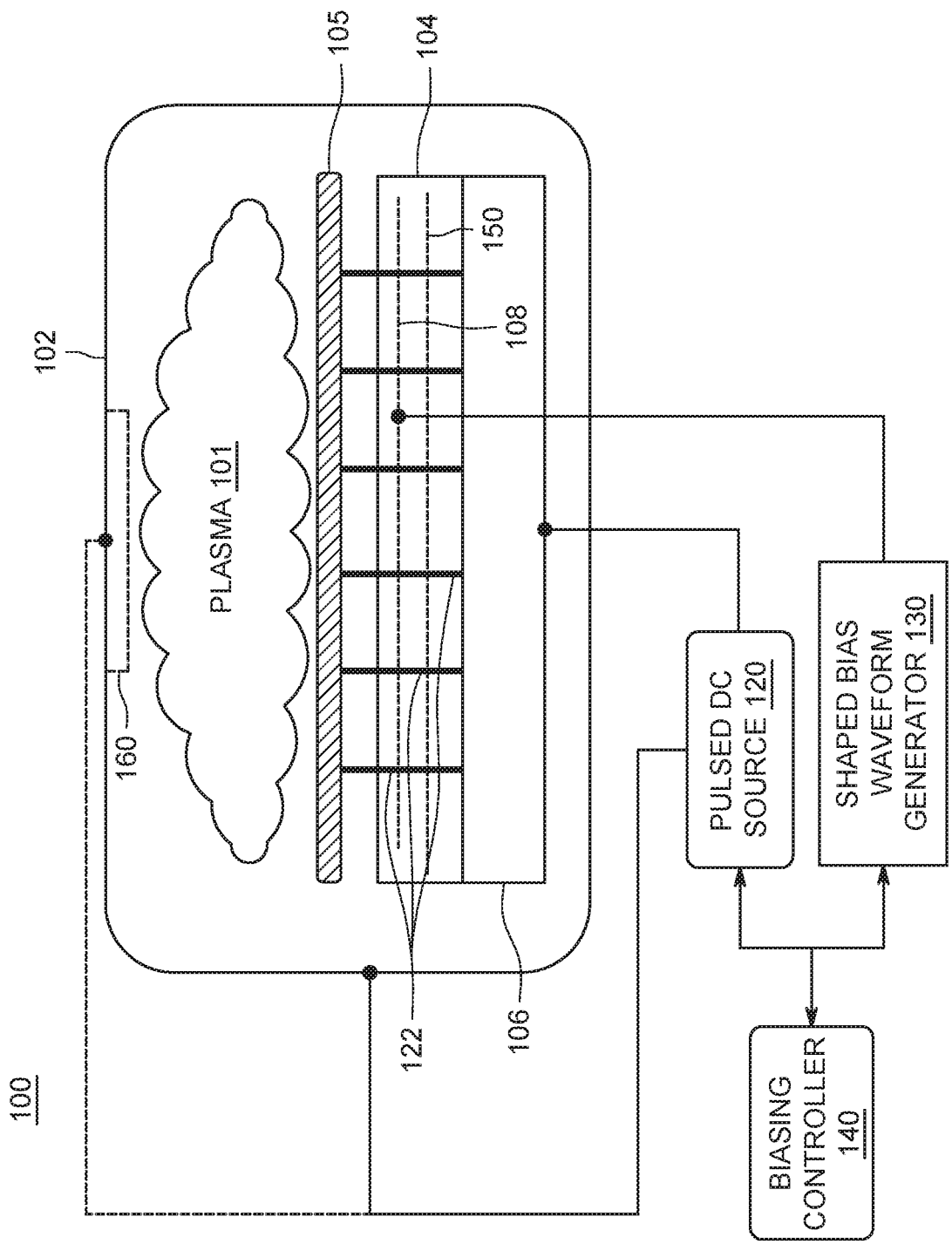
FIG. 1 is a block diagram illustrating a system for tunable workpiece biasing in accordance with exemplary embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a method and apparatus for tunable workpiece biasing in a plasma reactor are provided herein. In some embodiments, a system for tunable workpiece biasing in a plasma reactor includes a high voltage pulsed DC source (a first pulsed voltage source) coupled to a plasma reactor, a second pulsed voltage source that supplies low and medium voltages through the wire mesh embedded in an electrostatic chuck of the plasma reactor. By combining the high voltage pulsed DC source, and the second voltage source for low and medium voltages, the ion energy distributions are controllable by shifting the high voltage pulsed DC source to create a group of ions with energy in the range from 1,000 to 10,000 eV, while the lower ion energies can be tuned to form peaks or even bands of ion energies in the range of 0 to 1,500 eV. Accordingly, the ion energy distribution is tailored in the low and high energy ranges to give a desired ion energy distribution.

FIG. 1 is a block diagram illustrating a system 100 for tunable workpiece biasing in accordance with exemplary embodiments of the present disclosure.

In various embodiments, the system 100 of FIG. 1 can comprise components of a plasma processing chamber such as the AVATAR®, ADVANTEDGE™ MESA™, SYM3®, DPS®, PRECISION®, and PRODUCER®™ process chambers available from Applied Materials, Inc. of Santa Clara, Calif. or other process chambers.

The system 100 comprises a plasma chamber 102, an electrostatic chuck 104, a cooling base 106, a chucking mesh 108, a pulsed DC source 120 (or pulsing source), a shaped bias waveform generator 130, a biasing controller 140, an edge ring 150 and an anode 160. According to exemplary embodiments, the chucking mesh 108 is embedded in the electrostatic chuck 104. The electrostatic chuck 104 supports the workpiece, while the cooling base 106 supports the electrostatic chuck 104. The plasma chamber 102 further comprises a plurality of pins 122 that are disposed on the cooling base 106 at one end and extend through the electrostatic chuck 104 to make contact with the wafer 105 at the other end.

The plasma chamber 102 performs various operations and processes on a workpiece, such as wafer 105, by exposing the wafer 105 to plasma 101. The wafer 105 is placed inside the plasma chamber 102 and reactant gases are introduced into the chamber, the gases being irradiated with electromagnetic energy to ignite and maintain the plasma 101.

Depending upon the composition of the gases from which the plasma 101 is formed, the plasma 101 may be employed to etch a particular thin film from the wafer 105 or may be employed to deposit a thin film layer onto the wafer 105. The plasma 101 generally has a high ion density so that a high etch or deposition rate can be achieved on the wafer, and also so that less time is required to perform a given etch or deposition process, thus increasing throughput.

Independent control of the pulsed DC source 120 and the shaped bias waveform generator 130 is maintained by the biasing controller 140. In some embodiments, the biasing controller 140 is independent computer system which receives and sets parameters for the pulsed DC source 120 and the shaped bias waveform generator 130.

Pulsed DC sources previously have been used in applications for processing a wafer such as ion implantation. For some applications such as shallow junction formation in semiconductors, plasma doping systems are used. In a plasma doping system, a semiconductor wafer is placed on a conductive platen which functions as a cathode. An ionizable gas containing the desired dopant material is introduced into the chamber, and a high voltage pulse is applied between the platen and an anode or the chamber walls, establishing a plasma sheath in the vicinity of the wafer. The applied voltage causes ions in the plasma to cross the plasma sheath and to be implanted into the wafer. In plasma doping systems, the high voltage pulse from a pulsed DC source accelerates positive ions from the plasma towards the wafer, and in plasma doping applications the depth of implantation is related to the voltage applied between the wafer and the anode (or chamber wall). A plasma doping system using a pulsed DC source is described further in U.S. Pat. Nos. 5,354,381 and 6,020,592.

Figure 6:
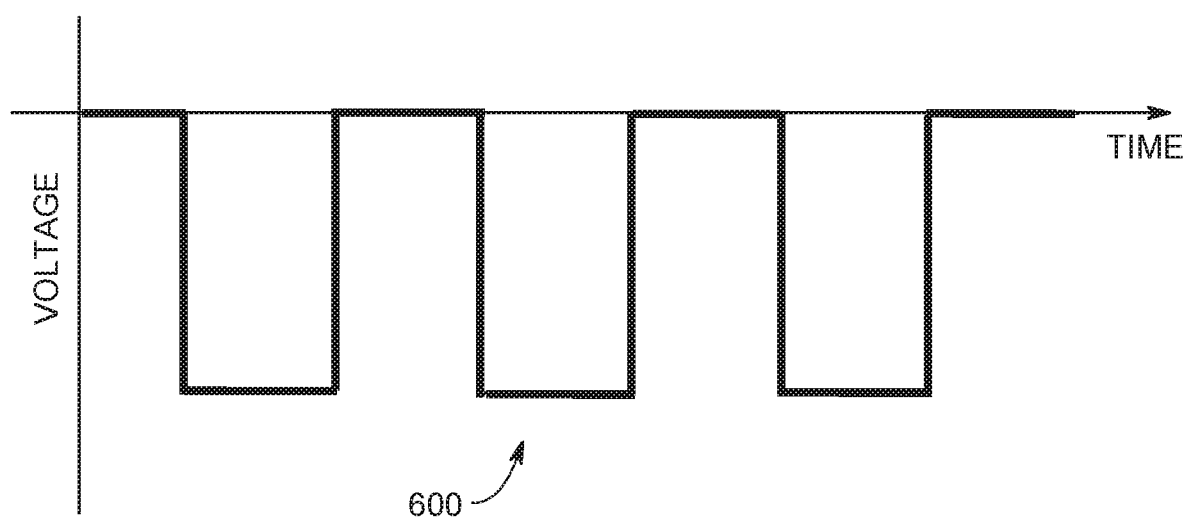
FIG. 6 illustrates a cyclic waveform emitted by the pulsed DC source in accordance with exemplary embodiments of the present disclosure.

The pulsed DC source 120 couples high voltage directly to a workpiece, such as wafer 105, via pins 122 and the anode 160 (or alternatively, the chamber walls). In embodiments, the pulsed DC source 120 generates high voltage pulses in the form of a cyclic waveform, for example, the waveform 600 illustrated in FIG. 6, where one cycle of the waveform comprises a first portion where the voltage is non-zero and a second portion where the voltage is zero. In exemplary embodiments, the non-zero voltage during the first portion is in the range from approximately 1 to 10 kV. In embodiments, the first portion is between 5% and 95% of the duration of a cycle; often expressed as the duty cycle of the cyclic waveform is between 5% and 95%. In embodiments, the pulse frequency of the cyclic waveform is between 100 Hz and 100,000 Hz.

In embodiments, the first portion of the waveform 600 comprises a first non-zero voltage and a second non-zero voltage. In embodiments, the first non-zero voltage and the second non-zero voltage are sequential in time. In embodiments, a non-zero voltage can be one or more than one value in successive pulses. In embodiments, a non-zero voltage can be one value for a first number of cycles, and a second value for a second number of cycles. In embodiments, the first number of cycles and the second number of cycles are repeated.

Figure 7:
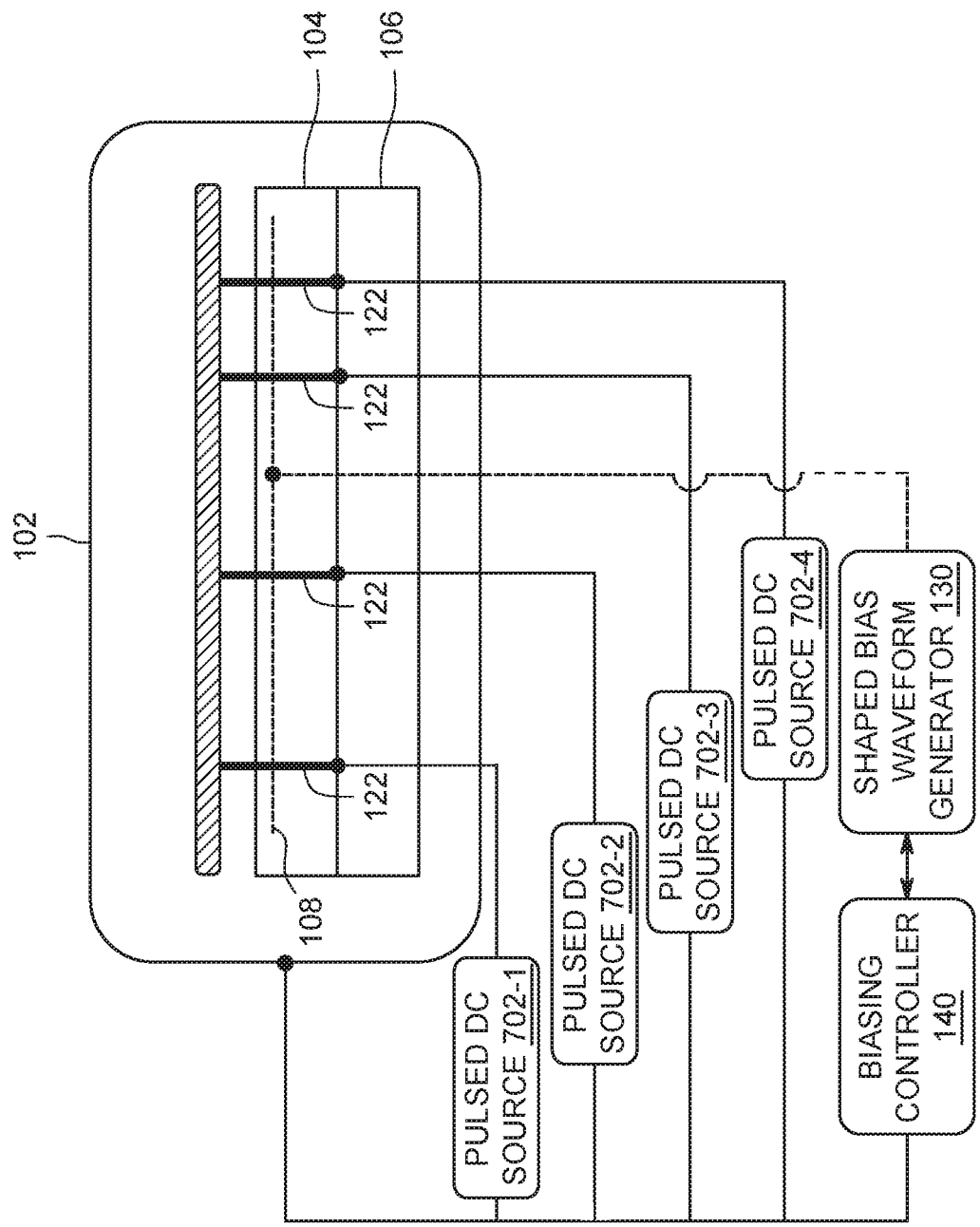
FIG. 7 is a block diagram of another embodiment of the system for tunable workpiece biasing in accordance with exemplary embodiments of the present disclosure.

According to another embodiment shown in FIG. 7, direct contact with a pulsed DC source to the workpiece is made through pins 122, but each pin is electrically isolated from the base and electrically isolated from each other pin. Each of the pins 122 is individually connected to an independent pulsed DC source, e.g., pulsed DC source 702-1, 702-2, 702-3 and 702-4 (collectively, pulsed DC source 702). In yet another embodiment illustrated in FIG. 8, a first group of pins 804 which are electrically isolated from the base is connected to a first pulsed DC source 802-1, and a second group of pins 806 which are electrically isolated from the base is connected to a second pulsed DC source 802-2 (collectively, pulsed DC source 802), such that the first and second groups of pins do not have any common members. Generally, coupling pins to independent pulsed DC sources allows local spatial control of the ion energy distribution across a workpiece, which allows for adjustment for other non-uniformities in the processing system. Also, the system can be adjusted for non-uniformities that exist on the wafer from prior processes, or to adjust for expected non-uniformities in subsequent processes. In such embodiments, independently controlling the pulsed DC sources to each pin compensates for edge effects at the edge of the wafer.

Figure 8:
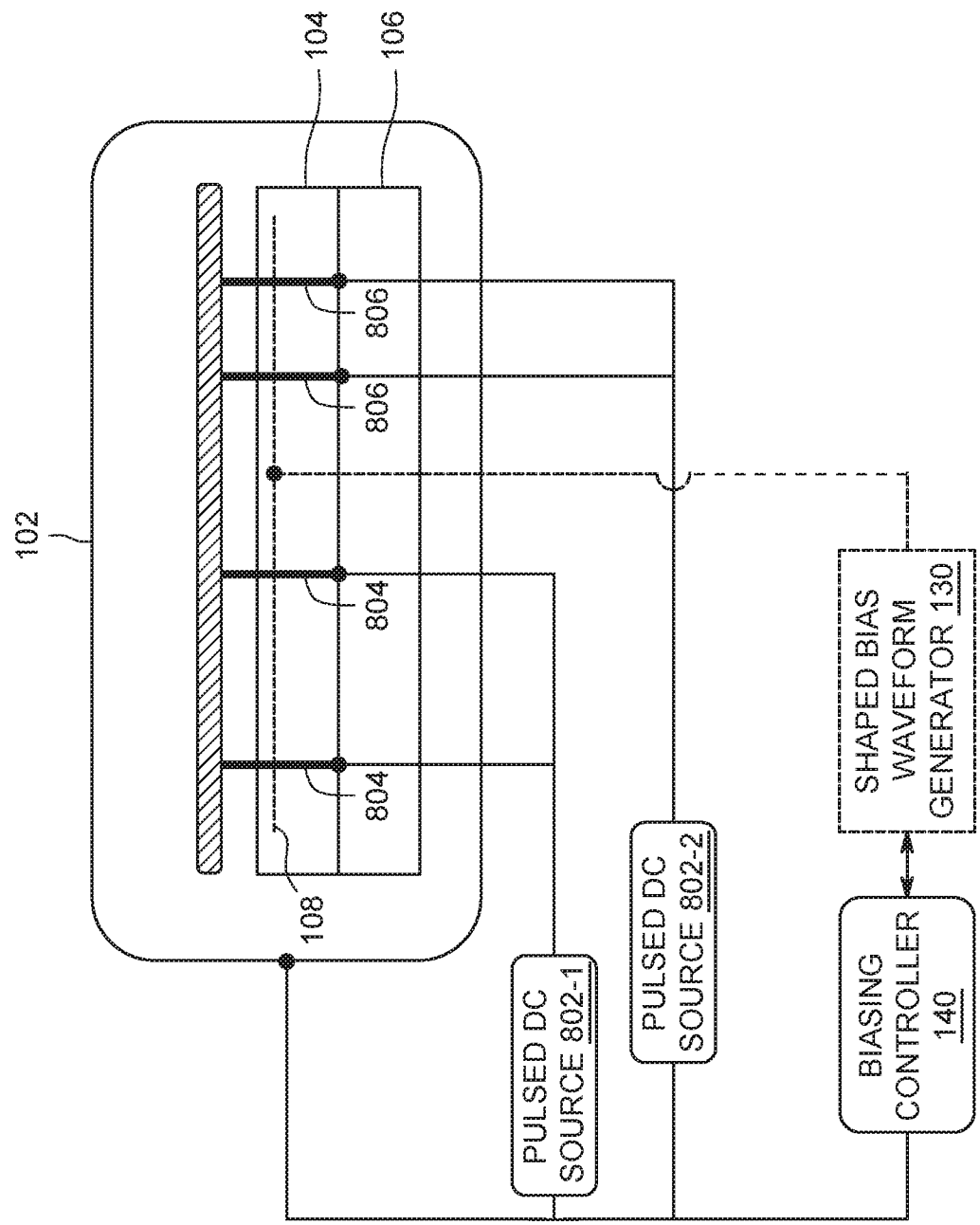
FIG. 8 is a block diagram of yet another embodiment of the system for tunable workpiece biasing in accordance with exemplary embodiments of the present disclosure.

In the embodiments described in FIG. 7 and FIG. 8, the shaped bias waveform generator 130 is optional and the pulsed DC sources 702 and 802 provide tailored ion distributions by controlling the voltages across each source by the biasing controller 140. The shaped bias waveform generator 130 can be included to enhance the tailoring of the ion distribution across the workpiece, or for ion implantation in specialized features of the workpiece.

The shaped bias waveform generator 130 is directly coupled to the chucking mesh 108, though in some embodiments, the shaped bias waveform generator 130 may be coupled to power electrode 113. By applying the waveform bias (for example, shown in FIG. 6) to the chucking mesh

108, the voltage drop across the chuck capacitance is so small that the voltage amplitude measurable at the workpiece (e.g., wafer 105) surface, at any time during the application of the bias pulse substantially approximates the voltage amplitude of the pulse (i.e., does not vary more than 0 to 5%).

The chucking mesh 108 is capacitively coupled to the wafer 105. The shaped bias waveform generator 130 supplies pulsed voltages in the exemplary range of 0 to 1.5 kV (e.g., low to medium voltages). In some embodiments, the shaped bias waveform generator 130 provides a constant or continuous voltage to the wafer 105 via the chucking mesh 108, while in other embodiments the shaped bias waveform generator 130 is configured to provide voltage ramps, allowing for broadband ion energy distribution. In a broadband ion energy distribution, ions obtain energies in a continuous range from a first ion energy to a second ion energy, where the second ion energy is larger than the first ion energy. In embodiments, the first ion energy is defined as the energy which is less than the energy of 95% of the ions accelerated due to coupling of shaped bias waveform generator 130. In some embodiments, the second ion energy is defined as the energy which is greater than the energy of 95% of the ions accelerated due to coupling of shaped bias waveform generator 130. According to one embodiment, the first ion energy is 10 eV and the second ion energy is 3000 eV.

In an embodiment, the high voltage cyclic waveform from the pulsed DC source 120 can vary from 100 Hz and 100,000 Hz in range, while the shaped bias waveform generator 130 pulses at 400 kHz according to some embodiments. In some embodiments, the pulses emitted from the shaped bias waveform generator 130 occur during the second portion of the DC pulsing cycle when the DC voltage from the pulsed DC source 120 is zero.

The biasing controller 140 controls the ion energy distributions by setting a non-zero voltage from the pulsed DC source 120 during the first portion of the DC pulsing cycle anywhere from 1 kV to 10 kV, while the lower and medium ion energies can be tuned to form peaks or bands of energy in the range of 0 kV to 1.5 kV. Thus, the ion energy distribution can be tailored in the low, medium, and high energy ranges to give a desired distribution. Such ion energy distribution control is advantageous, for example, in embodiments where ions are required to reach the bottom of high aspect ratio features in wafer 105. One such application is the 3D-NAND memory hole etch, where aspect ratios are routinely greater than 30:1.

During the second portion of the pulsed DC cycle, the biasing controller 140 evaluates a received voltage from the wafer 105 via, for example, a voltage probe (or some other equivalent implement) and, if the voltage has changed from previous readings and/or is not within a tolerance of a predetermined voltage level, the biasing controller 140 determines a control signal to be communicated to the shaped bias waveform generator 130 to adjust the voltage being provided by the shaped bias waveform generator 130 to the chucking mesh 108 to cause the voltage at the wafer 105 to remain constant and/or within a tolerance of a predetermined voltage level.

In one embodiment, the biasing controller 140 implements an iterative process to determine a control signal to communicate to the shaped bias waveform generator 130. For example, in one embodiment, upon determining that the voltage received requires adjustment, the biasing controller 140 communicates a signal to the shaped bias waveform generator 130 to cause an adjustment in the voltage being supplied by the shaped bias waveform generator 130 to the chucking mesh 108. After the adjustment, the voltage at the wafer 105 is again evaluated by the biasing controller 140. If the voltage captured at the wafer 105 has become more constant or closer to the tolerance of the predetermined voltage level, but still requires more adjustment, the biasing controller 140 communicates another control signal to the shaped bias waveform generator 130 to cause an adjustment to the voltage being supplied by the shaped bias waveform generator 130 to the chucking mesh 108 in the same direction. If, after adjustment, the voltage captured at the substrate has become less constant or farther from the predetermined voltage level, the biasing controller 140 communicates another control signal to the shaped bias waveform generator 130 to cause an adjustment to the voltage being supplied by the shaped bias waveform generator 130 to the chucking mesh 108 in the opposite direction. Such adjustments can continue to be made until the voltage at the substrate remains constant and/or within a tolerance of a predetermined voltage level. In one embodiment, the biasing controller 140 digitizes the voltage signal from a reading from the wafer 105 and communicates the digitized voltage signal to the bias supply to periodically adjust the shaped pulse bias waveform so that the wafer (substrate) voltage remains constant and/or within a tolerance of a predetermined voltage level.

In other embodiments in accordance with the present principles, a signal representative of the voltage at a workpiece being processed (e.g., wafer 105) can be captured using the optional edge ring 150. For example, in one embodiment and with reference back to FIG. 3, the edge ring 150 is used to sense voltage measurements representative of a voltage at a substrate being processed. In one embodiment in accordance with the present principles, the edge ring 150 is located directly below the chucking mesh 108 and is large enough to overlap the edges of any power electrode to which the shaped bias waveform generator 130 may be coupled, according to an embodiment where the shaped bias waveform generator 130 is coupled directly to a power electrode instead of the chucking mesh 108. Because of the composition and location of the edge ring 150, the edge ring 150 is electrically coupled to the workpiece being processed so as to sense a voltage at the workpiece being processed which is within, for example, 5 to 7 percent of the actual voltage at the workpiece.

The low and medium energy ions from the shaped bias waveform generator 130 complement the high energy peak from the pulsed DC source 120 and stimulate other beneficial properties. For example, the low and medium energy ions aid polymer sidewall deposition, resulting in reduced bow in deep etches and improved mask selectivities.

Figure 2:
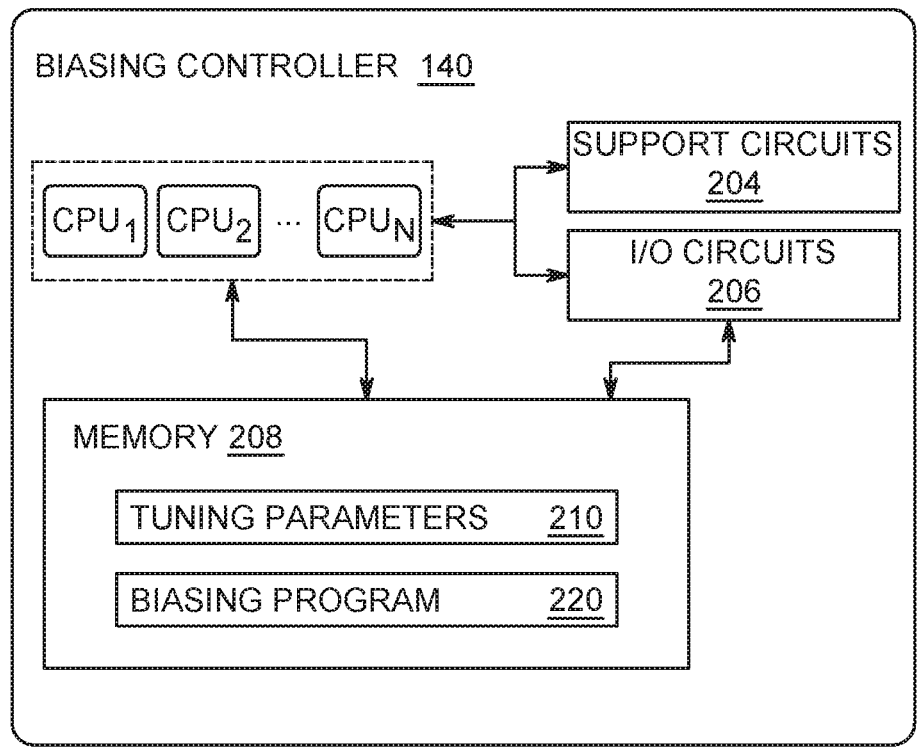
FIG. 2 is a block diagram of a biasing controller in accordance with exemplary embodiments of the present disclosure.

FIG. 2 is a block diagram of the biasing controller 140 in accordance with exemplary embodiments of the present disclosure.

Various embodiments of method and apparatus for tailoring ion distribution may be executed by the biasing controller 140. According to one embodiment, the biasing controller 140 comprises one or more CPUs 1 to N, support circuits 204, I/O circuits 206 and system memory 208. The system memory 208 may further comprise tuning parameters 210 and a biasing program 220. The CPUs 1 to N are operative to execute one or more applications which reside in system memory 208. The biasing controller 140 may be used to implement any other system, device, element, functionality or method of the above-described embodiments. In the illustrated embodiments, the biasing controller 140 may be configured to implement method 400 (FIG. 4) as processor-executable executable program instructions. The biasing program 220 controls the operation of both the pulsed DC source 120 and the shaped bias waveform generator 130 for tailored ion distribution across wafer 105.

In different embodiments, biasing controller 140 may be any of various types of devices, including, but not limited to, a personal computer system, desktop computer, laptop, notebook, or netbook computer, mainframe computer system, handheld computer, workstation, network computer, a mobile device such as a smart phone or PDA, a consumer device, or in general any type of computing or electronic device.

In various embodiments, biasing controller 140 may be a uniprocessor system including one processor, or a multiprocessor system including several processors (e.g., two, four, eight, or another suitable number). CPUs 1 to N may be any suitable processor capable of executing instructions. For example, in various embodiments, CPUs 1 to N may be general-purpose or embedded processors implementing any of a variety of instruction set architectures (ISAs). In multiprocessor systems, each of CPUs 1 to N may commonly, but not necessarily, implement the same ISA.

System memory 208 may be configured to store program instructions and/or data accessible by CPUs 1 to N. In various embodiments, system memory 208 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing any of the elements of the embodiments described above may be stored within system memory 208. In other embodiments, program instructions and/or data may be received, sent or stored upon different types of computer-accessible media or on similar media separate from system memory 208 or biasing controller 140.

In one embodiment, I/O circuits 206 may be configured to coordinate I/O traffic between CPUs 1 to N, system memory 208, and any peripheral devices in the device, including a network interface or other peripheral interfaces, such as input/output devices. In some embodiments, I/O circuits 206 may perform any necessary protocol, timing or other data transformations to convert data signals from one component (e.g., system memory 208) into a format suitable for use by another component (e.g., CPUs 1 to N). In some embodiments, I/O circuits 206 may include support for devices attached through various types of peripheral buses, such as a variant of the Peripheral Component Interconnect (PCI) bus standard or the Universal Serial Bus (USB) standard, for example. In some embodiments, the function of I/O circuits 206 may be split into two or more separate components, such as a north bridge and a south bridge, for example. Also, in some embodiments some or all of the functionality of I/O circuits 206, such as an interface to system memory 208, may be incorporated directly into CPUs 1 to N.

A network interface may be configured to allow data to be exchanged between biasing controller 140 and other devices attached to a network, such as one or more display devices (not shown), or one or more external systems or between nodes. In various embodiments, a network may include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, the network interface may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

Input/output devices may, in some embodiments, include one or more display terminals, keyboards, keypads, touchpads, scanning devices, voice or optical recognition devices, or any other devices suitable for entering or accessing data by one or more biasing controller 140. Multiple input/output devices may be present or may be distributed on various nodes of biasing controller 140. In some embodiments, similar input/output devices may be separate from biasing controller 140 and may interact with one or more nodes of biasing controller 140 through a wired or wireless connection, such as over a network interface.

Figure 4:
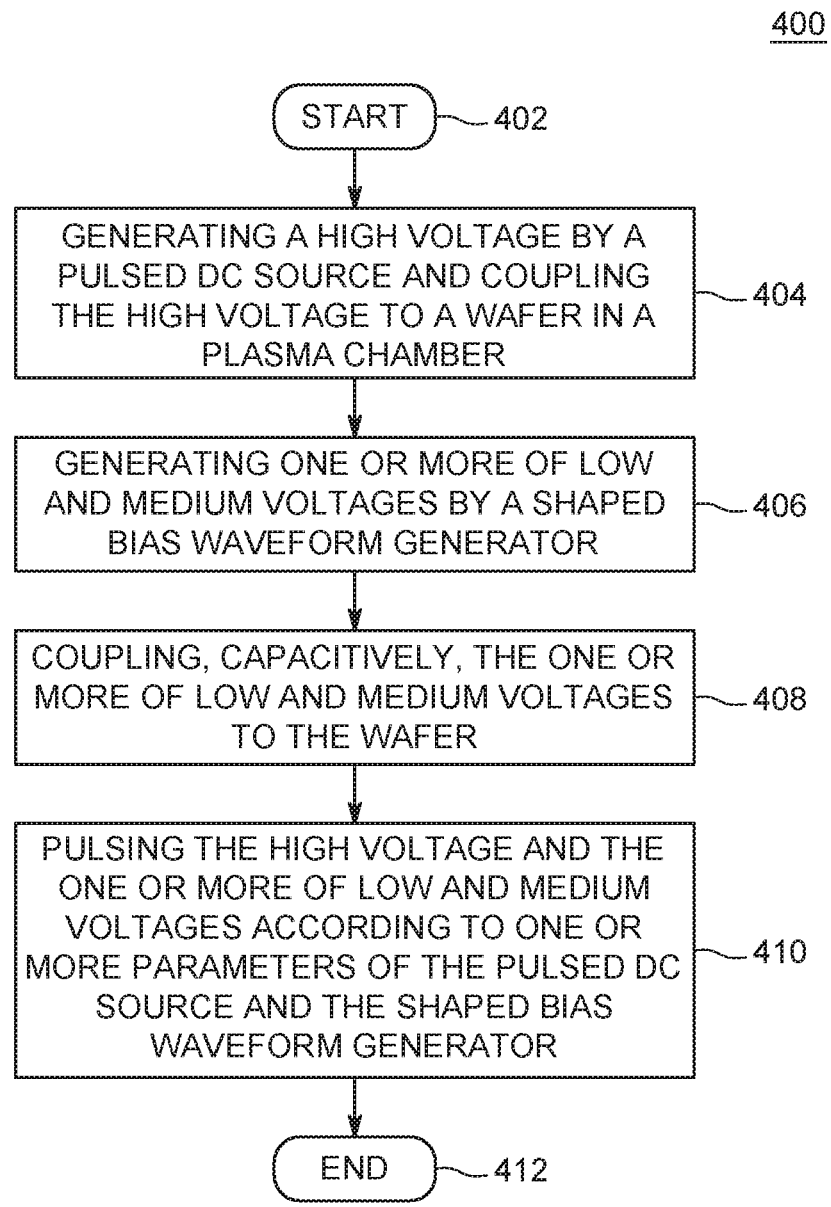
FIG. 4 is a flow diagram representing a method of tailoring the ion distribution across a semiconductor workpiece in a plasma chamber in accordance with exemplary embodiments of the present disclosure.

In some embodiments, the illustrated computer system may implement any of the methods described above, such as the methods illustrated by the flowcharts of FIG. 4. In other embodiments, different elements and data may be included.

Those skilled in the art will appreciate that biasing controller 140 is merely illustrative and is not intended to limit the scope of embodiments. In particular, the computer system and devices may include any combination of hardware or software that can perform the indicated functions of various embodiments, including computers, network devices, Internet appliances, PDAs, wireless phones, pagers, and the like. Biasing controller 140 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from biasing controller 140 may be transmitted to biasing controller 140 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium or via a communication medium. In general, a computer-accessible medium may include a storage medium or memory medium such as magnetic or optical media, e.g., disk or DVD/CD-ROM, volatile or non-volatile media such as RAM (e.g., SDRAM, DDR, RDRAM, SRAM, and the like), ROM, and the like.

Figure 3:
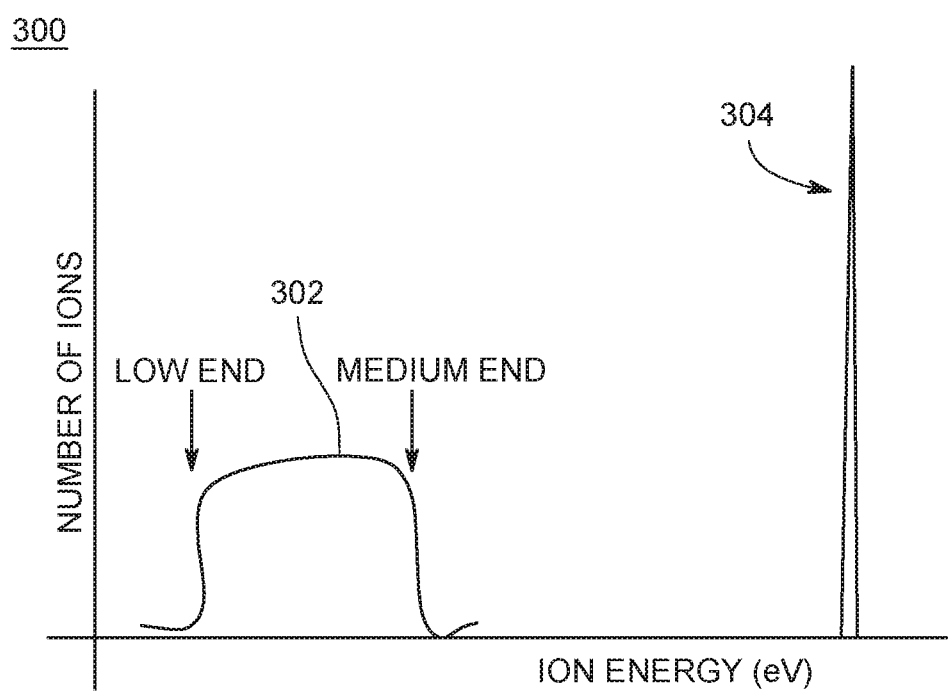
FIG. 3 is one example of an ion distribution curve generated by the apparatus of FIG. 1 in accordance with exemplary embodiments of the present disclosure.

FIG. 3 is one example of an ion energy distribution function as shown in graph 300 of the apparatus of FIG. 1, in accordance with exemplary embodiments of the present disclosure.

The graph 300 illustrates a first curve 302 and a second curve 304. The first curve 302 illustrates the distribution of ions at differing low and medium ion energies, caused by the shaped bias waveform generator 130. The second curve 304 illustrates the ion distribution at high ion energies, showing a high energy peak from the pulsed DC source 120. While the distribution from the shaped bias waveform generator discussed above is roughly square, other distributions are possible with the tunable biasing described in the present disclosure because the shaped bias waveform generator is independently controlled from the high ion energy peak which comes from the pulsed DC source 120.

For example, the low end of first curve 302 may be disposed towards lower ion energies, for example, approximately 100 V, while the medium end is disposed towards higher ion energies, for example approximately 800 V. In an additional embodiment, the low end of first curve 302 may be disposed towards lower ion energies, for example, approximately 200 V, while the medium end is disposed towards higher ion energies, for example approximately 1000 V. In yet another embodiment, the low end of first curve 302 may be disposed towards lower ion energies, for example, approximately 20 V, while the medium end is disposed towards higher ion energies, for example approximately 500 V.

FIG. 4 is a flow diagram representing a method 400 of tailoring the ion distribution across a semiconductor workpiece in a plasma chamber in accordance with exemplary embodiments of the present disclosure.

The biasing controller 140 is an exemplary implementation of the method 400 in accordance with exemplary embodiments of the present disclosure.

At 402, the biasing controller begins method 400. At 404, the biasing controller controls the pulsed DC source 120 to generate a high voltage, and to couple the high voltage to a wafer in a plasma chamber, e.g., wafer 105 in plasma chamber 102.

At 406, the biasing controller controls the shaped bias waveform generator 130 to generate low and medium voltages. At 408, these low and medium voltages are coupled, capacitively, to a wafer.

The method then proceeds to 410, where the biasing controller 140 alternatively pulses the high voltage and the medium and low voltages, to tailor ion energy distribution of the flux of ions directed towards the workpiece, such that high energy ions are available to reach the bottom of high aspect ratio features in the workpiece.

The method 400 ends at 412.

Figure 5:
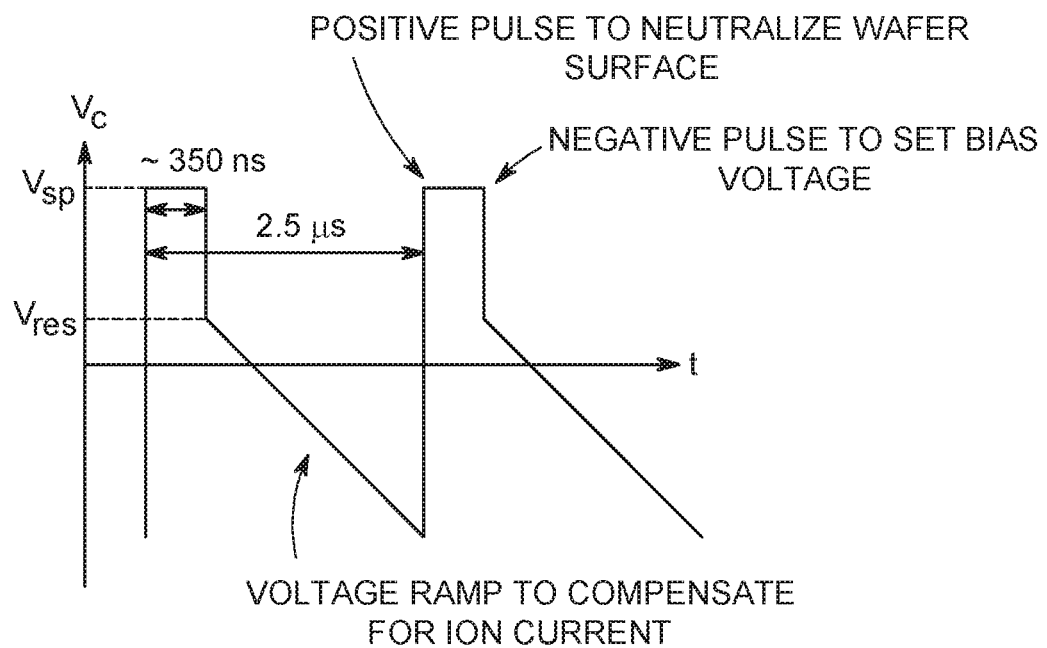
FIG. 5 illustrates a shaped pulse bias waveform emitted by the shaped bias waveform generator, and coupled to a plasma chamber in accordance with exemplary embodiments of the present disclosure.

FIG. 5 illustrates a shaped pulse bias waveform emitted by the shaped bias waveform generator 130, and coupled to a plasma chamber in accordance with exemplary embodiments of the present disclosure.

The shaped bias waveform generator 130 couples the pulsed waveform shown in FIG. 5 to the chucking mesh 108 of the system 100.

For the shaped pulse bias to function as intended, currently several capacitance values must be either known or estimated. In particular, the shaped pulse bias waveform (FIG. 5) requires that the total voltage supplied to the chucking mesh 108 is divided among the electrostatic chuck 104 and the sheath charge which forms in the space between the plasma and the electrostatic chuck support surface or workpiece disposed thereon (referred to as the "space charge sheath" or "sheath"). While an electrostatic chuck capacitance, $C_{CK}$, can be readily ascertained, values of stray capacitance ($C_{STR}$) and sheath capacitance ($C_{SH}$) have been found to vary unpredictably with respect to time. The stray capacitance, $C_{STR}$, for example, is determined by conditions within a plasma processing chamber and, accordingly, is sensitive to such factors as thermal expansion of processing chamber components and the like.

Functionally, the electrostatic chuck and sheath act as two capacitors connected in series, and since the input voltage waveform applied to one of the electrodes of the electrostatic chuck capacitor is controlled, to determine how the total applied voltage will split between the capacitors and how much voltage there will be on the sheath, both capacitance values need to be known.

The methods described herein may be implemented in software, hardware, or a combination thereof, in different embodiments. In addition, the order of methods may be changed, and various elements may be added, reordered, combined, omitted or otherwise modified. All examples described herein are presented in a non-limiting manner. Various modifications and changes may be made as would be obvious to a person skilled in the art having benefit of the present disclosure. Realizations in accordance with embodiments have been described in the context of particular embodiments. These embodiments are meant to be illustrative and not limiting. Many variations, modifications, additions, and improvements are possible within the scope of the present disclosure. Accordingly, plural instances may be provided for components described herein as a single instance. Finally, structures and functionality presented as discrete components in the example configurations may be implemented as a combined structure or component. These and other variations, modifications, additions, and improvements may fall within the scope of embodiments as defined in the claims that follow.

While the foregoing is directed to embodiments of the present disclosure, other and further embodiments of the disclosure may be devised without departing from the basic scope thereof.

The invention claimed is:

1. A method for tunable workpiece biasing in a plasma chamber comprising:
   generating a first high voltage by a first pulsed voltage source using DC voltages and coupling the first high voltage to a workpiece in the plasma chamber via at least one direct connection, the at least one direct connection enabling ion energy control in the workpiece near the at least one direct connection;
   generating one or more of low and medium voltages by a second pulsed voltage source;
   coupling, capacitively, the one or more of low and medium voltages to the workpiece; and
   pulsing the first high voltage and the one or more of low and medium voltages by a biasing controller, the biasing controller adjusting the first and second pulsed voltage sources in combination to achieve a configurable ion energy distribution in the workpiece.

2. The method of claim 1, further comprising:
   pulsing the first pulsed voltage source at a first frequency of approximately 100 Hz to approximately 100,000 Hz.

3. The method of claim 1, further comprising:
   pulsing the first pulsed voltage source with a duty cycle of approximately 5% to approximately 95%.

4. The method of claim 1, further comprising:
   pulsing the first pulsed voltage source at a first voltage for at least one or more duty cycles and at a second voltage for at least one or more duty cycles.

5. The method of claim 1, further comprising:
generating a second high voltage by a third pulsed voltage source using DC voltages and coupling the second high voltage to the workpiece in the plasma chamber.

6. The method of claim 5, further comprising:
coupling the first high voltage to at least one pin in an electrostatic chuck supporting the workpiece, the at least one pin directly coupled to the workpiece; and
coupling the second high voltage to at least one other pin in the electrostatic chuck, the at least one other pin directly coupled to the workpiece.

7. The method of claim 1, further comprising:
adjusting the second pulsed voltage source using a voltage ramp to provide an ion energy distribution ranging from a first ion energy to a second ion energy, wherein the second ion energy is greater than the first ion energy.

8. The method of claim 7, further comprising:
generating the first ion energy with an energy of approximately 10 eV; and
generating the second ion energy with an energy of approximately 3000 eV.

9. The method of claim 1, further comprising:
pulsing the second pulsed voltage source a frequency of approximately 400 kHz.

10. The method of claim 1, further comprising:
adjusting one or more voltage parameters with the biasing controller to modify a waveform emitted by the second pulsed voltage source, based on voltages sensed at the workpiece.

11. The method of claim 1, further comprising:
pulsing the first pulsed voltage source with the biasing controller at a voltage from approximately 1 kV to approximately 10 kV during a first pulse.

12. The method of claim 1, further comprising:
alternately pulsing the first pulsed voltage source and the second pulsed voltage source with the biasing controller.

13. The method of claim 1, further comprising:
generating voltages with a shaped bias waveform with the second pulsed voltage source.

14. The method of claim 1, further comprising:
generating the second pulsed voltage source with one or more voltages in a continuous range of low to medium voltages of greater than 0 to approximately 1.5 kV.

15. A method for tunable workpiece biasing in a plasma chamber, comprising:
generating a high voltage by a first pulsed voltage source and coupling the high voltage to a workpiece in a plasma chamber;
generating one or more of low and medium voltages by a second pulsed voltage source;
coupling, capacitively, the one or more of low and medium voltages to the workpiece; and
pulsing the high voltage and the one or more of low and medium voltages by a biasing controller, wherein the first pulsed voltage source supplies a high voltage, a maximum of the high voltage during a pulse being approximately 1 to 10 kV, and wherein the second pulsed voltage source supplies one or more voltages in a continuous range of low to medium voltages, wherein the continuous range is greater than 0 to approximately 1.5 kV.

16. The method of claim 15, further comprising:
generating high voltage pulses at a pulse frequency of approximately 100 Hz to approximately 100,000 Hz with the first pulsed voltage source; and
generating pulses at a pulse frequency of approximately 400 kHz with the second pulsed voltage source.

17. The method of claim 15, further comprising:
adjusting one or more voltage parameters based on voltages sensed at the workpiece to modify a waveform of the second pulsed voltage source.

18. A system for tunable workpiece biasing, comprising:
a plasma chamber that performs plasma processing on a workpiece;
a first pulsed voltage source using DC voltages, coupled directly to the workpiece in the plasma chamber via at least one direct connection, the at least one direct connection enabling ion energy control in the workpiece near the at least one direct connection;
a second pulsed voltage source coupled capacitively to the workpiece; and
a biasing controller comprising one or more processors, and memory, wherein the memory comprises a set of computer instructions that when executed by the one or more processors, controls the first pulsed voltage source and the second pulsed voltage source, the biasing controller adjusting the first and second pulsed voltage sources in combination to achieve a configurable ion energy distribution in the workpiece.

19. The system of claim 18, wherein the first pulsed voltage source supplies a first pulse at high voltage, wherein a maximum of the high voltage during a first pulse is approximately in a range of 1 to 10 kV.

20. The system of claim 18, wherein the biasing controller alternately pulses the first pulsed voltage source and the second pulsed voltage source.

* * * * *